[12] United States Patent
Chao et al.

(10) Patent No.: US 6,649,919 B2
(45) Date of Patent: Nov. 18, 2003

(54) REAL TIME MONITORING SIMULTANEOUS IMAGING AND EXPOSURE IN CHARGED PARTICLE BEAM SYSTEMS

(75) Inventors: Peter S. Chao, Aloha, OR (US); Steve Rosenberg, Newberg, OR (US)

(73) Assignee: FEI Company, Hillsboro, OR (US)

( * ) Notice: Subject to any disclaimer, the term of this patent is extended or adjusted under 35 U.S.C. 154(b) by 45 days.

(21) Appl. No.: 09/960,224

(22) Filed: Sep. 20, 2001

(65) Prior Publication Data

US 2002/0066863 A1 Jun. 6, 2002

Related U.S. Application Data

(60) Provisional application No. 60/234,001, filed on Sep. 20, 2000.

(51) Int. Cl.[7] .............................. A61N 5/00; G21G 5/00; G01N 23/00; G21K 7/00
(52) U.S. Cl. ..................... 250/492.2; 250/307; 250/309
(58) Field of Search .............................. 250/309, 497.2, 250/306, 307, 310

(56) References Cited

U.S. PATENT DOCUMENTS

| 5,149,976 | A | 9/1992 | Sipma ..................... 250/492.2 |
| 5,495,110 | A | 2/1996 | Ohnishi et al. ............. 250/309 |
| 5,589,780 | A | 12/1996 | Ueda et al. ................. 324/751 |
| 5,616,921 | A | 4/1997 | Talbot et al. ............... 250/307 |
| 6,031,229 | A | 2/2000 | Keckley et al. ............. 250/309 |

Primary Examiner—Stephen D. Meier
Assistant Examiner—Alfred Dudding
(74) Attorney, Agent, or Firm—Michael D. Scheinberg

(57) ABSTRACT

A beam processing system, such as a focused ion beam or an electron beam system, addressing an arbitrary series of points and receives data from the points in real time. The data can be used to image or to alter the processing, even within a single dwell period, thereby allowing closed feedback loop for processing. A delay calculator automatically determines the delay between instructing the system to move the beam and detecting a signal from the work piece surface so that the detector signal can be matched with the location on the work piece at which the signal was generated.

21 Claims, 8 Drawing Sheets

REAL TIME MONITORING SIMULTANEOUS IMAGING AND EXPOSURE IN CHARGED PARTICLE BEAM SYSTEMS

This application claims priority from U.S. Prov. Pat. App. No. 60/234,001, filed Sep. 20, 2000, which is hereby incorporated by reference.

FIELD OF THE INVENTION

The present invention relates to the field of imaging and processing microscopic features using beams of photons or charged particles.

BACKGROUND OF THE INVENTION

Beams of charged particles or photons are widely used to view and process extremely small structures. Instruments used to produce images of microscopic structures include scanning electron microscopes (SEMs), scanning transmission electron microscopes (STEMs), scanning optical instruments, and focused ion beam (FIB) systems.

In these instruments, photons or charged particles, such as electrons or ions, are directed at a specimen, and secondary particles emitted from the surface or backscattered particles from the primary beam are collected. The type, energy, or quantity of secondary or backscattered particles can be determined to infer information about the surface points impacted by the beam. Images can be formed to represent the spatial distribution of certain properties or qualities, such as composition and topography, of the material surface or sub-surface.

When acquiring an image, the primary beam is scanned across the surface in a raster pattern, that is, the top row is scanned from a first edge and then each subsequent row is scanned in the same direction, with the beam moving rapidly back to the first edge after completing each row so that the beam will be in position to start the next row. By scanning juxtaposed rectangles of different sizes, it is possible to approximate irregular exposure patterns.

Information received from the detectors typically must be processed to create signals that are useful for controlling a display, such as a CRT-type display or flat-panel-type display. Processing steps may include amplification and further signal conditioning to enable digital storage of the processed signal data. Additional processing may be performed on the stored data for image enhancement prior to or subsequent to display. In scanning electron microscopes and scanning ion microscopes, for example, image data can be collected and displayed, with or without processing, in real time. The scanning of the beam in the display CRT must be coordinated with the scanning of the imaging instrument, so that the points on the image correspond in position with the points on the specimen.

Focused ion beam (FIB) systems are widely used in microscopic-scale manufacturing operations because of their ability to image, etch, mill, deposit, and analyze with great precision. Ion columns on FIB systems using gallium liquid metal ion sources (LMIS), for example, can provide five to seven nanometer lateral imaging resolution. Focused ion beams mill by sputtering, that is, physically knocking atoms and molecules from the specimen surface. Because of their versatility and precision, FIB systems have gained universal acceptance in the integrated circuit (IC) industry as necessary analytical tools for use in process development, failure analysis, and most recently, defect characterization. FIB systems are used in a variety of other micromachining operations including the fabrication of thin film magnetic heads for reading and writing information to data storage media, and micro electromechanical systems (MEMS).

The ion beam typically scans the surface of the specimen in a raster pattern and secondary electrons are collected to form an image of the specimen surface. Secondary ions can be collected and analyzed to form a map showing the composition of the surface. This map, or image, can be used to determine the feature to be milled. The raster pattern is reduced and moved to the feature to be milled, and the ion beam current is increased to mill the surface. A gaseous material is often directed to the sample at the impact point of the ion beam, and the ions induce a chemical reaction that selectively increases the etch rate or deposits material, depending on the gaseous compound that is used.

Any time the ion beam impacts the surface, atoms are sputtered from the surface. Although this is the desired result in a milling operation, when the ion beam is used for imaging, the sputtering causes unintentional surface damage. While the damage can be reduced by reducing the number of ions that hit the surface during imaging, for example, by reducing the beam current or by increasing the speed at which the beam traverses the specimen, some damage is unavoidable.

Raster scanning always covers a rectangular area. When the area of interest is non-rectangular, it is an unavoidable consequence of the raster scan pattern that some material outside the area of interest will also be subject to unwanted exposure and consequent damage of material. Therefore, raster scanning to produce images results in particle beam-induced irradiation damage or unwanted alteration.

One method of for reducing damage when using a raster pattern is described in U.S. Pat. No. 5,616,921 to Talbot et al. for "Self Masking FIB Milling." The system of Talbot et al. uses a raster pattern to scan a focused ion beam. A "mask image" is created by comparing the image of points to a threshold value. When the beam is rastered to points exceeding the threshold value, the beam is attenuated, for example, by blanking or defocusing.

During milling operations, the beam is sometimes scanned in an arbitrary pattern, rather than in a raster pattern. A pattern generator implemented in hardware or software provides a sequence of points to the beam controller, which moves the beam from one arbitrary pixel to another. (Although the term "pixel" originally refereed to a "picture element" on a display, it is also used to indicate a "dwell point" on a work piece surface, that is, a point to which the beam is directed and which is often represented by a single pixel on a display showing the work piece.) Arbitrary patterns may be generated which move the beam over the material surface in a manner which confines the beam to the area of interest and eliminates damage or alteration to surrounding areas. The beam is thereby confined within an area of interest defined by the pattern generator and performs its function to produce the desired material alteration within it.

However, while prior art pattern generation methods confine the desired material alteration to the area of interest during milling, it is necessary to examine or image the material thus exposed to determine if further material processing is necessary. Often the steps of processing and then reimaging the surface must be performed several times before the process is complete. At each step, it is required to switch from a generated pattern to a raster pattern to form an image of the specimen. Switching not only takes time, which reduces the productivity of the operation, using a raster pattern for images results in undesirable exposure of areas of the specimen that are not being processed.

SUMMARY OF THE INVENTION

An object of the invention is to enhance the use of systems using beams of photons or charged particles to image or process microscopic structures.

The present invention comprises a method and apparatus for using beams to process material. In accordance with one aspect of the invention, image information is collected as the beam is directed in an arbitrary pattern of points on the specimen. By collecting image information as the beam is directed in an arbitrary pattern, beam-induced damage to the surface—which would occur if a raster pattern were used—is avoided.

In accordance with another aspect of the invention, image information is collected as a beam is processing material, and a separate imaging step is not required. The invention thus permits "real time" imaging or data collection during processing. Collecting information as the material is being processed allows for "closed loop" processing, in which the results of the processing are available in real time for controlling further processing. Overprocessing can be avoided and the time required to switch between an imaging mode and a processing mode is eliminated, thereby increasing productivity.

In another aspect of the invention, the delay between instructions to move the beam to a point and the time at which a signal is detected from the surface at that point is determined. At the high scan rates used in modern scanning machines, the delay time can be many dwell periods, which would make the image out of synchronization with the beam. By calibrating the delay for particular operating parameters, an accurate image and placement of beam is maintained.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which.

DETAILED DESCRIPTION OF THE PREFERRED EMBODIMENTS

In accordance with one aspect of the present invention, a beam system acquires an image as the beam is directed toward the work piece in an arbitrary pattern. The term arbitrary pattern is used to indicate a specific sequence of individual points on the surface of the work piece. Unlike a raster scan where the scanning beam moves from side to side and top to bottom, the specific points in an arbitrary pattern can be scanned in any desired order or sequence and the scanning beam can be moved directly from point to point. As a result, only the specific points of interest need be exposed to the beam. The invention thus avoids exposure to the beam and damage to areas that are not of immediate interest.

Another aspect of the invention allows for simultaneous imaging and processing, regardless of the scan method used. The invention also provides for imaging or processing at high scan rates by determining a system delay, thereby minimizing unintentional damage to the specimen.

Another aspect of the invention accomplishes the coupling of arbitrary pattern generation with digital memory storage of processed detector data or display of video data during a non-raster scan. Imaging of beam processed areas can be obtained during live exposure and the image displayed in real time. Thus the inherent limitations of raster scanning techniques are overcome.

The work piece upon which the present invention operates could be, for example, an integrated circuit, a thin film magnetic recording head, or an MEMS device. In some embodiments, the beam is directed to an arbitrary set of points for milling, and image information is collected in "real time," that is, as the beam is milling. The invention also provides flexibility in imaging. For example, it is not required that the dwell time be the same for each pixel. Also, image information can be continually updated in memory and compared with an end-point criterion while the beam is dwelling at a single point.

The term "image" is used in a broad sense to include not only a displayed image showing the appearance of the surface, but also to include any collection of information characterizing the multiple points on or below a surface. For example, a collection of data corresponding to the concentrations of an element at different point on a surface is a type of "image," even if the data is not displayed. Collecting information about points on the work piece is "imaging."

Figure 1:
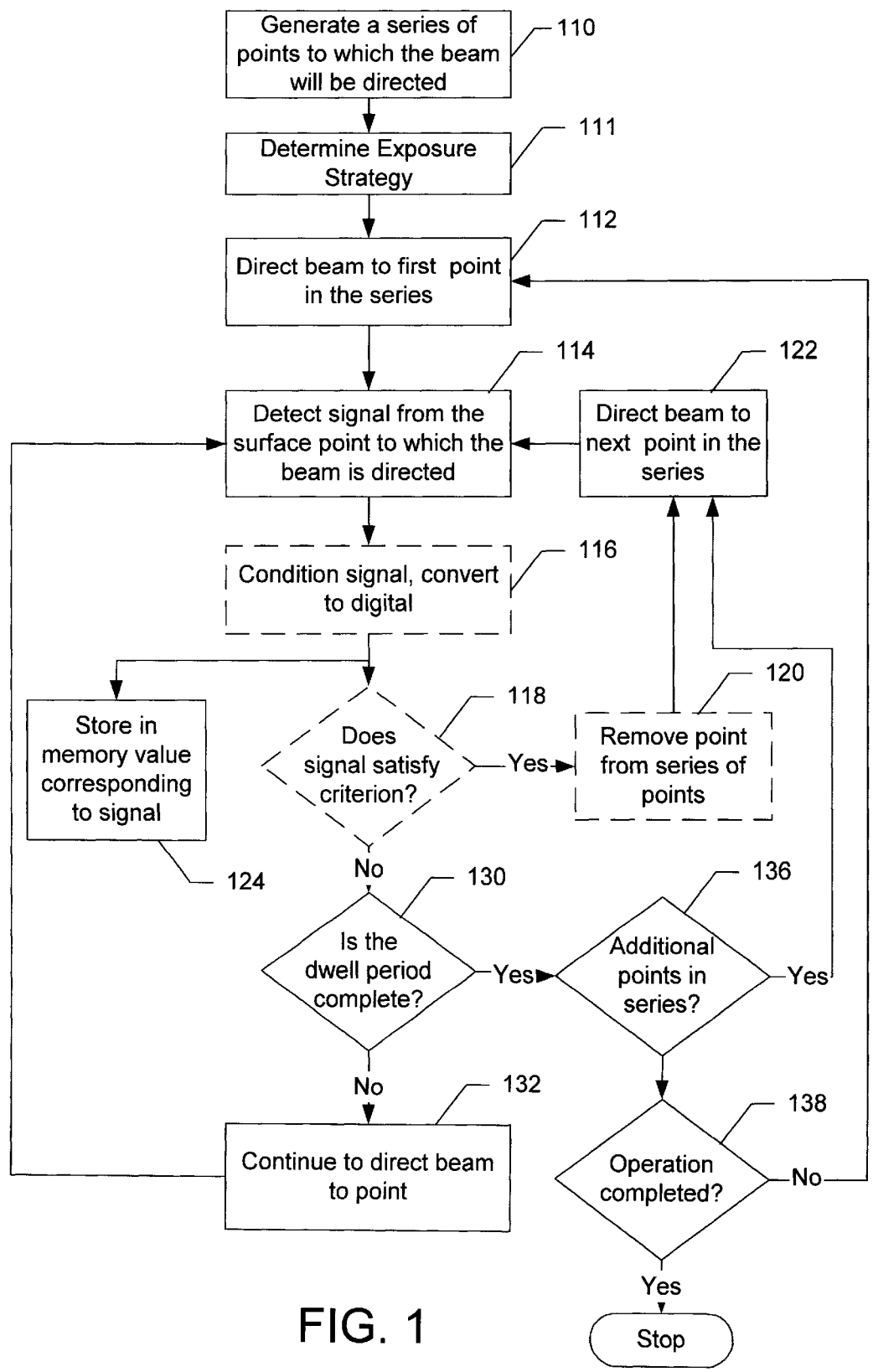
FIG. 1 is a flow chart showing the steps of one preferred embodiment of the present invention.

FIG. 1 is a flowchart showing the steps of a first preferred embodiment of the present invention. In step 110, a sequence of points is generated, the points indicating areas on the specimen surface to which a beam is to be directed. The points can be in an arbitrary pattern; they do not need to form a rectangle nor do they need to be scanned a row at a time as in a raster pattern. The points may be determined, for example, from the contrast pattern of an image, with the brighter points being designated for more processing than less bright points. The points could also be determined, for example, from a database that describes the specimen.

In step 111, an exposure strategy, including the total amount of beam exposure desired for the points of the work piece and the method for delivering that exposure, is determined. The total amount of exposure to the processing beam is estimated based upon the processing rate and the amount of material to be processes. For example, in a focused ion beam system used to mill material, the total exposure or ion dosage can be readily calculated from the sputter rate of the surface material and the thickness of the material to be removed. The sputter rate is a function the type of material being sputtered, the beam parameters, and the presence of any sputter-enhancing gases. Beam parameters include the type of ions used and energy of ions in the beam.

Once the total amount of ion exposure has been determined, a milling strategy is determined. Leaving the beam on each point for an extended period of time can produce a rough surface and exacerbate redeposition of sputtered material. It is therefore preferable to divide the exposure into multiple passes or loops around the specimen, with relatively short dwell times during each loop. For focused ion beams, dwell times of less than 1 μs are preferred, with dwell times of less than 500 ns more preferred. Dwell times of 100 ns are typical for non-contiguous points, but dwell times of up to 10 ms or much longer can be used. In some applications, the process can rely on end-point detection, that is, continuing to expose the work piece points to the beam until a detector indicates that processing is complete, instead of determining a total exposure dosage to be applied.

In step 112, the beam is directed to the first point in the sequence of points. In step 114, a signal is detected from the surface point to which the beam is directed. The invention can be used with virtually any type of primary beam and can use virtually any type of signal caused by the primary beam and representative of a property of the specimen at the impact point of the primary beam. The signal could be, for example, a secondary electron current, a secondary ion current, an Auger electron current, a backscattered electron or ion current, or a specimen holder current. The signal could be detected using, for example, a channel electron multiplier, a multichannel plate, or a scintillator. Most detectors produce a continuous signal, and "detecting" the signal from the surface point means sampling the detector output while the beam is addressed to that point.

In optional step 116, the detected signal is conditioned so that it can be more readily used and stored. For example, the signal may be amplified and converted from an analog into a digital signal that can be manipulated using digital logic and stored in a digital form.

In step 124, the information in the memory location corresponding to the point is updated based upon the detected signal. This updating could show, for example, that the point has become darker or lighter, indicating that material of one composition has been milled away by a focused ion beam and a different type of material is now being exposed to the beam at that point. Step 124 can be performed before, after, or concurrently with step 116. The signal is typically converted from an analog signal to a digital signal and stored in a digital memory. The memory typically has multiple memory locations corresponding to multiple points on the surface, with the information in the memory corresponding to a complete image of a portion of the specimen.

In the prior art of raster scanning, the beam current, and therefore the beam diameter, was reduced during imaging to enhance the resolution. In some embodiments of the invention, in which imaging occurs during processing, the image resolution will be reduced from that of a separate imaging step at reduced beam current. With concurrent processing and imaging, the image information for each dwell point is derived from the identical area that is being processed, so the resolution is appropriate for determining whether or not to continue processing that point.

The image can be displayed while the other steps are occurring. The image itself can be derived from the values stored in memory, or, in some embodiments, the image can be produced in real time from the incoming signal. Because it is unnecessary in the present invention to scan every point in a rectangle, an image may not be a complete representation of the specimen surface, but such a partial image is acceptable, even desirable, in applications in which the surface is easily damaged. In some embodiments, therefore, the memory may include only selected points and may not include locations corresponding to a viewable image.

The value stored in memory during step 124 is a representative value determined from the detected signal. The representative value is typically based on the strength of the signal and may represent, for example, a value between zero and 255 in which zero represents no detectable signal and 255 represents the maximum signal.

In optional step 118, a determination is made regarding whether the signal detected in step 114 satisfies a criterion. For example, the secondary electron signal strength may depend upon the composition of the work piece, and a signal strength criterion may indicate whether the beam is impinging on a conducting or an insulating material. The secondary electron current can then provide an indication as to whether a focused ion beam has completely milled through a first layer of material and is now impacted on a second layer. The criteria could also be a signal strength from a secondary ion mass spectrometer (SIMS) indicating that the ions being sputtered from the surface are of a particular type. The criterion can be different for different points on the surface, and there may be multiple criteria for a single point. The criterion is typically an end point detection criterion that shows the process is complete.

If the signal meets the specified criterion in optional step 118, the point is removed in step 120 from the sequence of points, and the ion beam is directed in step 122 to the next point in the sequence of points that was generated in step 110.

If the signal did not satisfy the criterion in step 118, in step 130, the system uses clocks and counters to determine whether the beam has been positioned at the point for the specified dwell time. The dwell time was determined in step 111 as part of the exposure strategy. If in, step 130, it is found that the designated dwell time has elapsed, that point is finished its processing in the current loop. Step 136 then determines whether there are additional points in the sequence. If there are, the beam is directed in step 122 to the next dwell point.

If all points in the sequence of points have been addressed, in step 138 the system determines whether the process is complete. For example, the operator may have specified that the beam execute a predetermined number of loops. If all loops have been completed, the operation is stopped. If all loops have not been completed, the beam is directed to the first point in the sequence of points and another loop is begun in step 112.

If, in step 130, the beam has not been positioned at the point for the specified dwell time, the beam continues to be directed at the same point in step 132. In that event, a signal is again detected in step 114 from the surface point to which the beam is directed, and a new value, which may be determined by the signal alone or the signal combined with the previously stored value, is stored in memory in step 124. Skilled persons will understand that in many implementations, the signal is continuously detected while the beam dwells at a point and the process continues, rather than repeats, step 114. As before, the memory is updated in step 124 as the beam dwells at the dwell point. The memory can be updated multiple times during a single dwell period.

Figure 2:
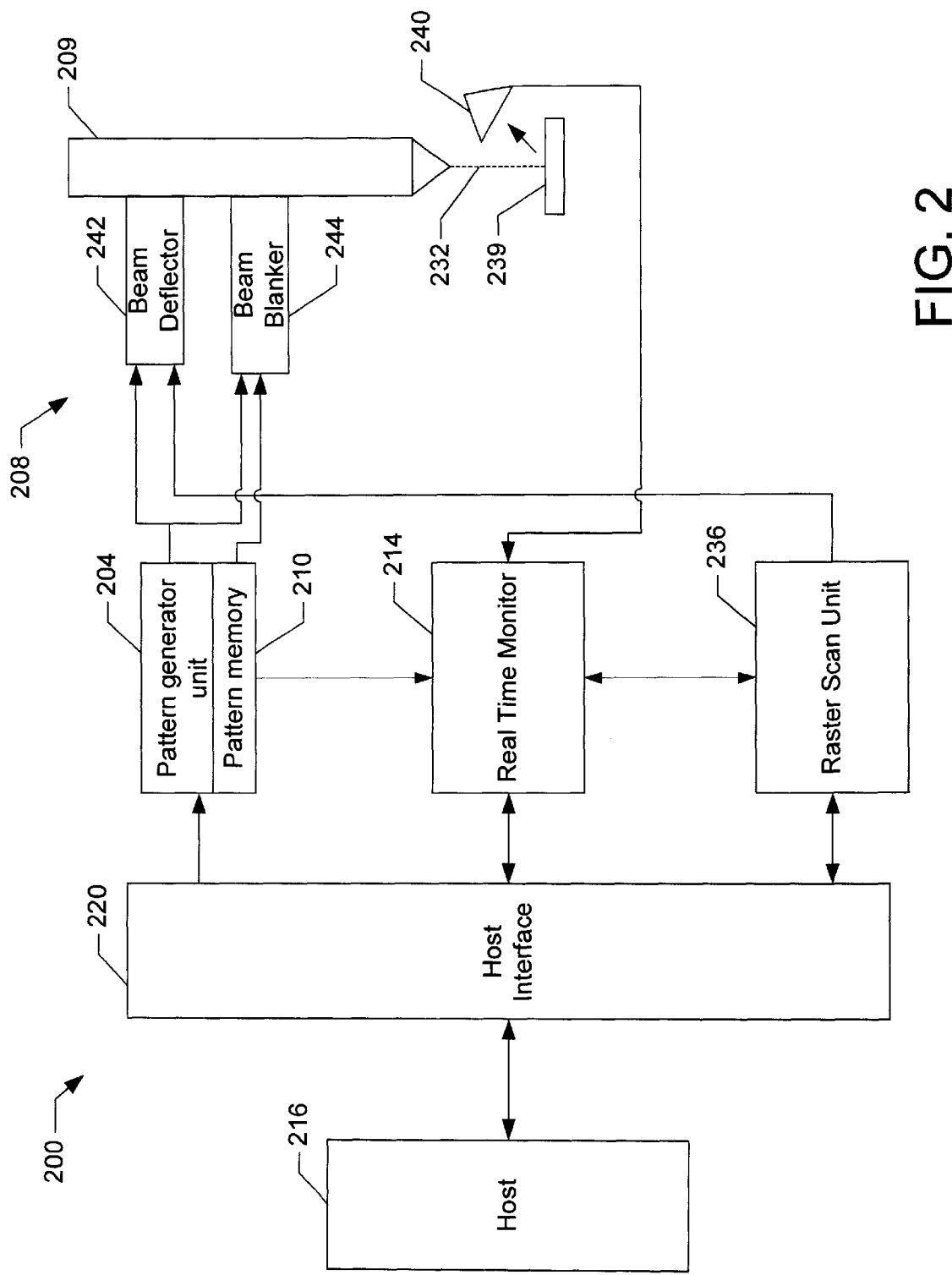
FIG. 2 shows schematically a preferred embodiment of the invention.

FIG. 2 depicts an embodiment of a system 200 of the present invention. The embodiment depicted in FIG. 2 comprises a pattern generation unit 204, a scanning beam system 208, a real time monitor unit 214, a host computer 216 and a host interface 220. In some embodiments, host computer 216 can be replaced with an embedded computer. Scanning beam system 208 includes the physical hardware of the beam system, including an optical column 209 and a detector 240 for generating a signal corresponding to a characteristic of the surface at each point to which the beam is directed. Optical column 209 includes a beam source, lenses for focusing the beam, a deflector 242 for steering the beam, and a beam blanker 244 for interrupting the beam. Pattern generation unit 204 generates a sequence of pattern points and directs beam system 208 to position the beam at those points. Real time monitor unit 214 receives signals from the detector, determines which point on the work piece surface corresponds to the signal at a specific time, so that detector information from the point can be stored in a memory location corresponding to the point and so that decisions about whether to continue processing that point can be made.

Figure 3:
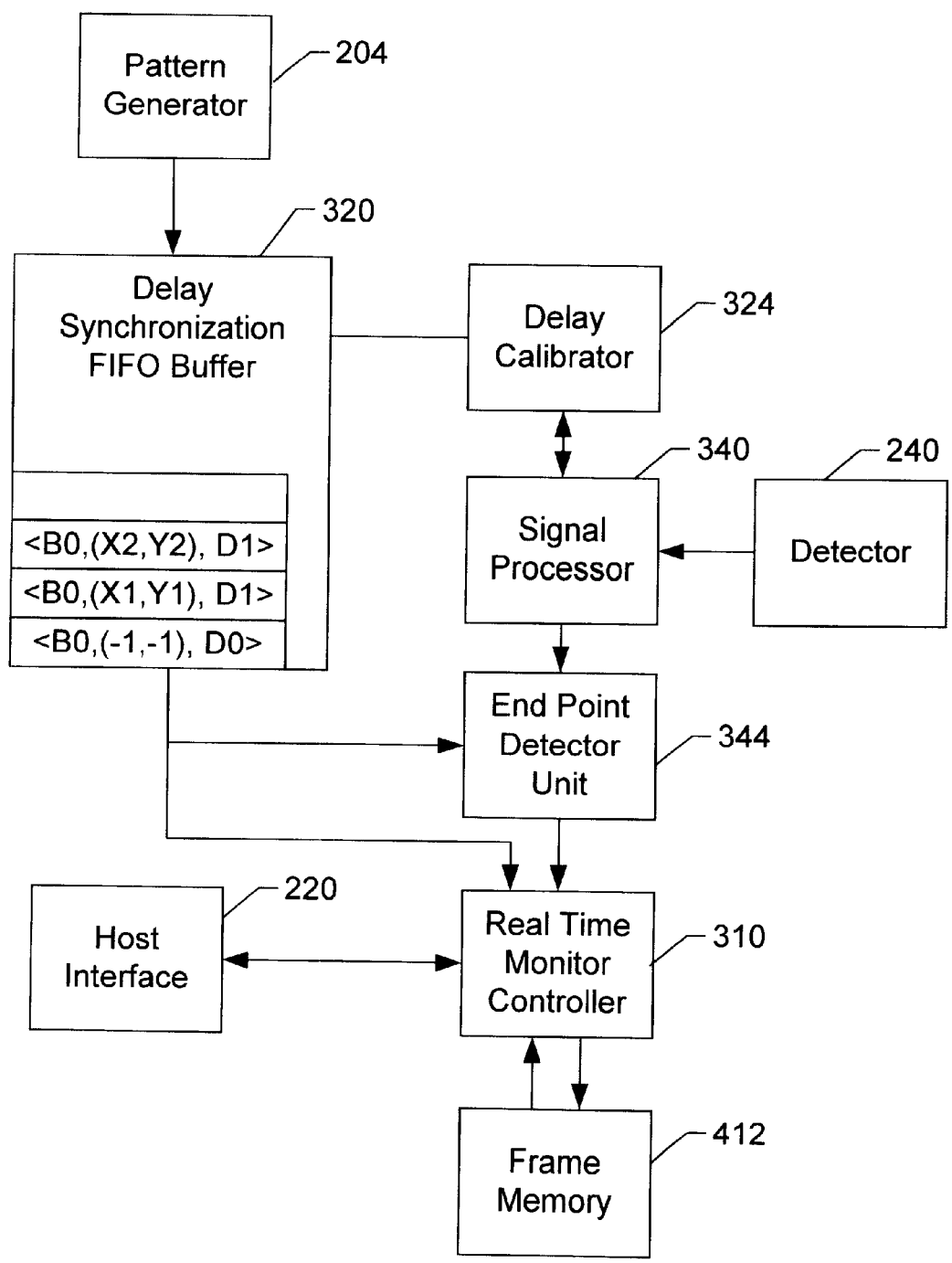
FIG. 3 is a schematic of one embodiment of a real time monitor unit for use with the embodiment shown in FIG. 2.

FIG. 3 shows the components of real time monitor unit 214 in more detail. Real time monitor unit 214 includes a FIFO delay synchronization buffer 320 that, as described in detail below, stores locations to which the beam is directed and makes the location information available after a calibrated delay so that the location information is synchronized with the detector signal corresponding to that location. Real time monitor unit 214 also includes a real time monitor controller 310, which controls the coordination of beam location information and surface characteristic information determined from the detector signal.

Figure 4:
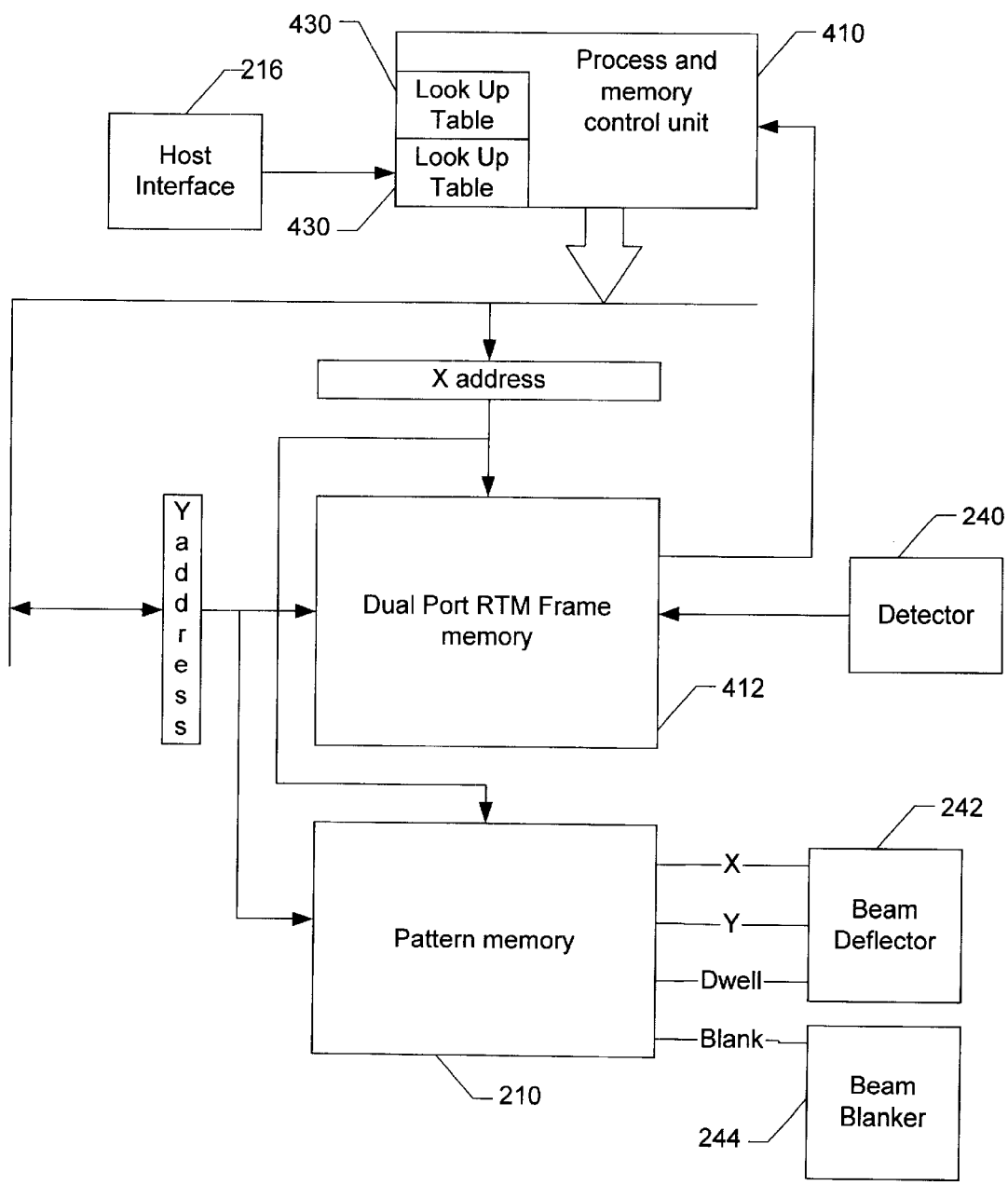
FIG. 4 shows a preferred memory configuration used with the system of FIG. 2

FIG. 4 shows a preferred memory structure in more detail. The memory includes a frame memory 412 that includes memory locations corresponding to points on the work piece 239 surface. These memory locations store information about the surface points, the information being derived from detector signals. The memory also includes pattern memory 210 that optionally stores points to which the beam is to be directed and that may part of the pattern generation unit 204. Storage and retrieval of information of memory is controlled by process and memory control unit 410, which also controls the overall processing, for example, by tracking the loop count and by determining when processing of individual points is complete and removing those points from further processing. The description below is in reference to FIGS. 2–4. To more clearly show the functional interrelation of the components, some components are shown in more than one drawing.

The pattern generator 204 (FIG. 2) generates an arbitrary sequence of pixel locations that are stored in a pattern memory 210, which can be part of pattern generator 204 or external to pattern generator 204. A pattern is a sequence of pattern points or pattern vectors, preferably containing the point coordinates or location, the "ON" or "OFF" state of the beam blanker, and the dwell time at that point. Thus, each point generated by pattern generator 204 or stored in pattern memory 210 is of the form <B, (x, y), D>, where B is an on/off blanking signal, (x, y) is a pattern point, or pixel location, and D is the dwell time.

Patterns, in general, are downloaded from host computer 216, and some patterns, such as lines, may be algorithmically created within the pattern generator 204. Pattern memory 210 may comprise, for example, SDRAM type memory supporting an array of between 128×128 and 64K×64K pattern points. Pattern memory may be controlled by non-concurrent batch write and sequential read type controller using a 16 bit address space. The memory preferably supports 16 bit resolution for the X and Y coordinates and 24 bit resolution for the dwell time, preferably using a linear dwell time scale. There are no restrictions on the pattern shapes that can be generated.

The pattern generator typically generates the sequence of points to be processed from an image of the work piece surface. The image, along with desired dwell times and loop-count, may be downloaded from a computer such as the host computer 216. Such an image can be generated using any method allowing a one-to-one mapping from the work piece surface to a collection of memory elements. For example, an image can be created by scanning the surface of the work piece with a scanning electron microscope or with a focused ion beam system using raster unit 236.

Dwell time and loop-count calculations are performed by the host computer 216 and sent to pattern generator 204 via the host interface 220. Dwell time is the time during which a point on the work piece is exposed to the beam and is calculated based upon variables such as sputter rate of the work piece material, redeposition, total etch time, and beam energy. The loop-count determines how many times the scanning of the sequence of pixel locations will be repeated, which determined the total etch time. The sequence of pixel locations downloaded from the host computer 216 is combined with dwell time data and blanking bits received from host computer 216 to form pattern vectors, which are stored in pattern memory 210. Algorithmically generated patterns do not need to be stored in memory.

Based upon the pattern vectors supplied by pattern generator 204, the beam deflector 242 directs the scanning beam 232 to the appropriate point on the work piece 239. For each pattern point, pattern generator 204 fetches from the pattern memory 210 a pattern vector, <Bi, (xi, yi), Di>. It sends Bi to the beam blanker 244 and (xi, yi) to the beam deflector 242. Simultaneously, it sends <(xi, yi), Di> to the RTM controller 310. After the desired dwell time (Di time units), pattern generator 204 fetches the next pixel location and moves the scanning beam 232 to the appropriate position. The process is repeated for all the remaining pixel locations.

The host interface 220 handles the data protocols for transferring commands and data between a host computer 216 and pattern generation unit 204, memory and process control unit 410, and RTM controller 310, and sends result data back to the host. Sample host commands include "Calibrate delay," "Download pattern vectors," "Start patterning," "Stop patterning," etc. Data transferred from the host computer 216 can include pattern vectors or time units. Data going back to the host computer 216 could include includes video signals or processed detector signals.

While the material processing is occurring, appropriate types of emitted particles are captured by a detector 240. Detector 240 can be any type of particle detector which is responsive to the charged particles and photons emitted, reflected, or absorbed during material processing by the scanning beam 232. For FIB processing of materials, for example, suitable detectors are channel electron multipliers, microchannel plates, and scintillator/photomultiplier detectors.

Output from detector 240 is amplified, converted from analog to digital, and subjected to appropriate signal processing by the detector signal processing unit 310 (FIG. 3). The resulting digital signal is directed to the process and memory control unit 410, which reads the incoming detector data as it is written to the dual port frame memory 412 and does a read-modify-write function required for each point.

One or more LUTs (look up tables) 430 can also be downloaded from the host computer 216 through host interface 220 to the process and memory controller 410. The values contained in LUT 430 are compared against the data received from the detector signal processing unit 206 for each pixel location. For example, LUT 430 may hold values corresponding to a desired depth of material removal by sputtering with a focused ion beam system. Alternatively, the values in LUT 430 may be used to indicate a transition across material boundaries. In either instance, when the value for a particular pixel location reaches the allowed value contained in an LUT 430 for that pixel location, process and memory controller 410 eliminates that pixel location from further processing, either by eliminating that pixel location from pattern memory 210 or by simply masking or filtering out the instructions to process that pixel. This function is indicated schematically as end point detection unit 344 in FIG. 3. This process is continued until all pixel locations have been removed from pattern memory 210. End point or end-of-process detection is thus possible based on real-time feed-back from the detector 240.

While the digital signal from the detector signal processing unit 340 is being transferred to process and memory controller 410, the same data is received by a RTM (real time monitor) controller 310 where it is coupled with the pattern pixel location data from pattern generator 204. At the same time as the pattern generator 204 is performing patterning, that is, is controlling the deflection of the beam 232, the real time monitor 214 is capturing video or other detector data. After calculation of system delay time where appropriate, RTM controller 310 fills the RTM frame memory 412 with the processed detector value of the corresponding pixel location. The calibration of the system delay time allows the sample clock to be delayed with reference to the pixel pattern clock RTM frame memory 412 comprises dual port RAM supporting from 256×256 to 16K×16K pixels or more. Each pixel requires 8 bits or more of memory. SDRAM may also be used. RTM controller 310 then sends the data stored in RTM frame memory 412 to the host computer 216 via the host interface 220. Only points to which the beam is directed need be updated in memory. In one embodiment, real time monitor unit 214 can capture detector information at a rate of 25 ns per pixel.

There is a time delay between sending the pixel location to the beam deflection electronics and the processed signal from the secondary emission detector arriving at the RTM controller. For the processing of materials requiring a high degree of accuracy, it is necessary to determine the system's delay time. The delay synchronization FIFO is used to make this delay adjustment. Pattern and detector output data are synchronized by establishing the delay time D0 during a delay calibration. A delay time synchronization is then performed by real time monitor unit 214

Prior to milling a pattern, the RTM controller 310 empties the FIFO delay synchronization memory 320 and initializes it with an entry <(xk, yk), Dk> with values of <(−1, −1), D0>, where (−1, −1) is a dummy location outside of the frame memory, and D0 is the system delay time. The value D0 is a characteristic of the system and is calculated as described below by the delay calibrator 324 shown in FIG. 3. For each pattern point, pattern generator 204 fetches from the pattern memory 210 a pattern vector, <Bi, (xi, yi), Di>. Pattern generator 204 sends Bi to the beam blanker 244 and (xi, yi) to the beam deflector 242. Simultaneously, pattern generator 204 sends <(xi, yi), Di> to the RTM controller 310. The RTM controller 310 puts the arriving vector <(xi, yi), Di> at the top of the FIFO delay synchronization memory 320.

Assuming <(xk, yk), Dk> has just dropped to the bottom of the FIFO delay synchronization memory 320, the RTM controller 310 clears a dwell time counter to zero and starts counting in time units, e.g. 25 nanoseconds per count. After each count of the pixel clock, typically 25 ns, the data value at (xk, yk) in the frame memory location is updated to Vk, the arriving processed detector output data from pattern point (xk, yk). Thus, the video value Vk is written to the frame memory location (xk, yk) at every tick of the pixel clock while the dwell counter is counting, not just on terminal count. The system observes the changes of the detector output during the dwell time, as frequent as possible, and make current decisions with regard to whether to continue milling that point.

At the end of Dk count (which is equal to the system delay time), the entry <(xk, yk), Dk> is removed from FIFO delay synchronization memory 320, and the next entry in FIFO delay synchronization memory 320 is dropped to the bottom. The process ends when FIFO delay synchronization memory 320 is empty.

Figure 5:
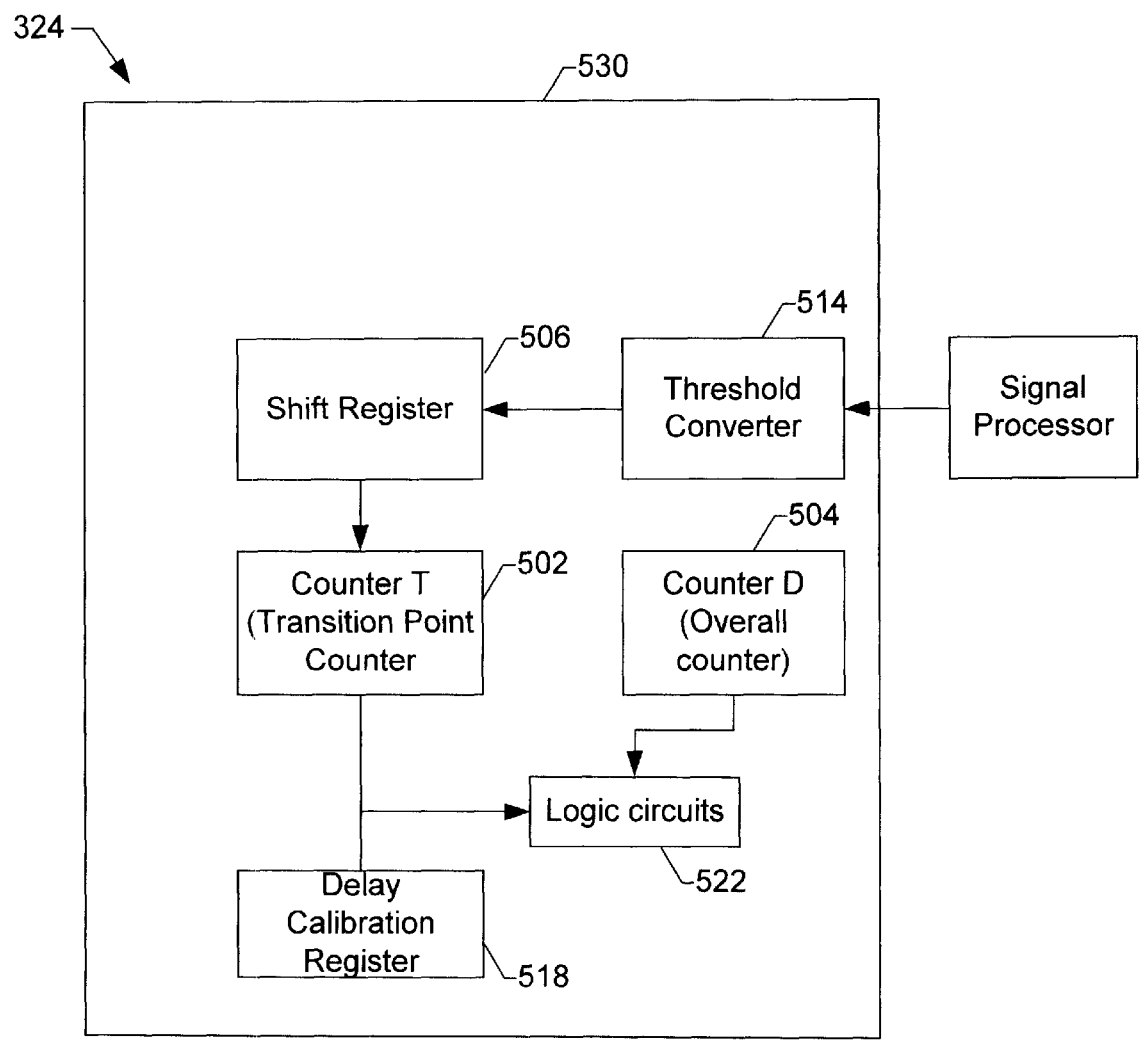
FIG. 5 is a schematic of a preferred embodiment of a delay calibrator for use with the system of FIG. 2.
Figure 6:
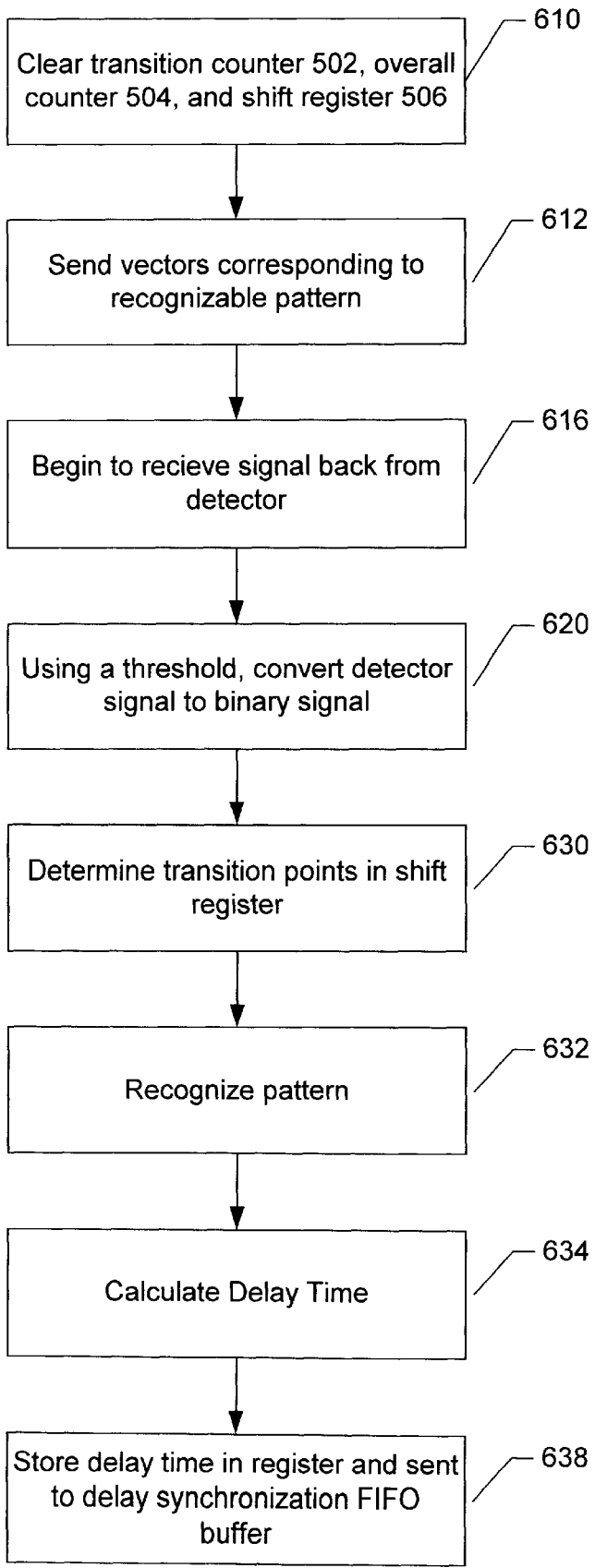
FIG. 6 is a flow chart showing another preferred embodiment of the present invention.

The delay calibrator 324 takes advantage of the fact that there is no signal from the detector when the beam is blanked. The transition points between unblanked (signal) and blanked (no signal) conditions can be used to establish a calibration pattern. The time between sending a unique vector pattern to beam system 208 and detecting the unique pattern through detector 240 establishes the system delay time. The signal received from the detector is recognized because of its unique pattern. FIG. 5 shows that the components used in a preferred delay calibrator 324 include a transition counter 502, an overall counter 504, a shift register 506, a threshold converter 514, a calibration register 518, and logic circuits 522. All of the components of delay calibrator 324 can be implemented in a field programmable gate array (FPGA) 530 or other means known to those skilled in the art of logic design. FIG. 6 is a flow chart showing the steps used to calibrate the delay. Unlike the prior art, delay calibration is automatic, meaning that it is performed by the system when requested by an operator, or when some event, such as a change in temperature, initiates a delay calibration.

In step 610, transition counter 502, overall counter 504, and shift register 506 are cleared. In step 612, a recognizable pattern of vectors is sent to scanning beam system 208. For example, a series of simple pattern vectors, <blank, (x, y), 10>, <unblank, (x, y), 10>; <blank, (x, y), 10>; <unblank, (x, y), 10> is sent to the scanning beam system 208 by pattern generator 204. The above pattern can be repeated many times. Such a series will cause the beam to blank and unblank in a periodic manner, which will cause a corresponding repeating signal to be received from detector. The components of delay calibrator 324 recognize the signal and determine the delay between when the pattern is sent to beam system 208 and the corresponding signal is received.

In step 616, delay calculator 324 begins to receive a signal is received from detector 240 through signal processor 340. To facilitate recognition of the pattern, in step 620 a threshold converter 502 converts the signal from the detector signal processing unit 206 to binary values (1 or 0) according to a given threshold established by experiment to determine the average noise level. The binary values are processed by the shift register 506 in step 630 to determine transition points. The shift register 506 stores the value in and value out at each time step. Thus a value of (1, 0) indicates that the digital signal was changing from high to low at the corresponding time step. Transition point counter 502 counts the time between transition points, whereas overall counter 504 counts time from the beginning of the calibration cycle. Logic circuit 522 compares the pattern of transitions with the known calibration pattern to recognize the calibration pattern in step 632. The detection of a known signal is common, for example, in the telecommunications art. In step 634, once the calibration pattern is recognized, the delay time between the known time at which the pattern was sent out and the time at which the pattern was received is readily determined from overall counter 504 and the calibration pattern duration. This value is stored in the delay calibration register 518 and sent to the FIFO delay synchronization memory 320 in step 638. Although the delay calibration and use of a delay is describes with respect to a system that addresses an arbitrary sequence of points, the delay can also be used to increase the accuracy of a rastering system.

Figure 7:
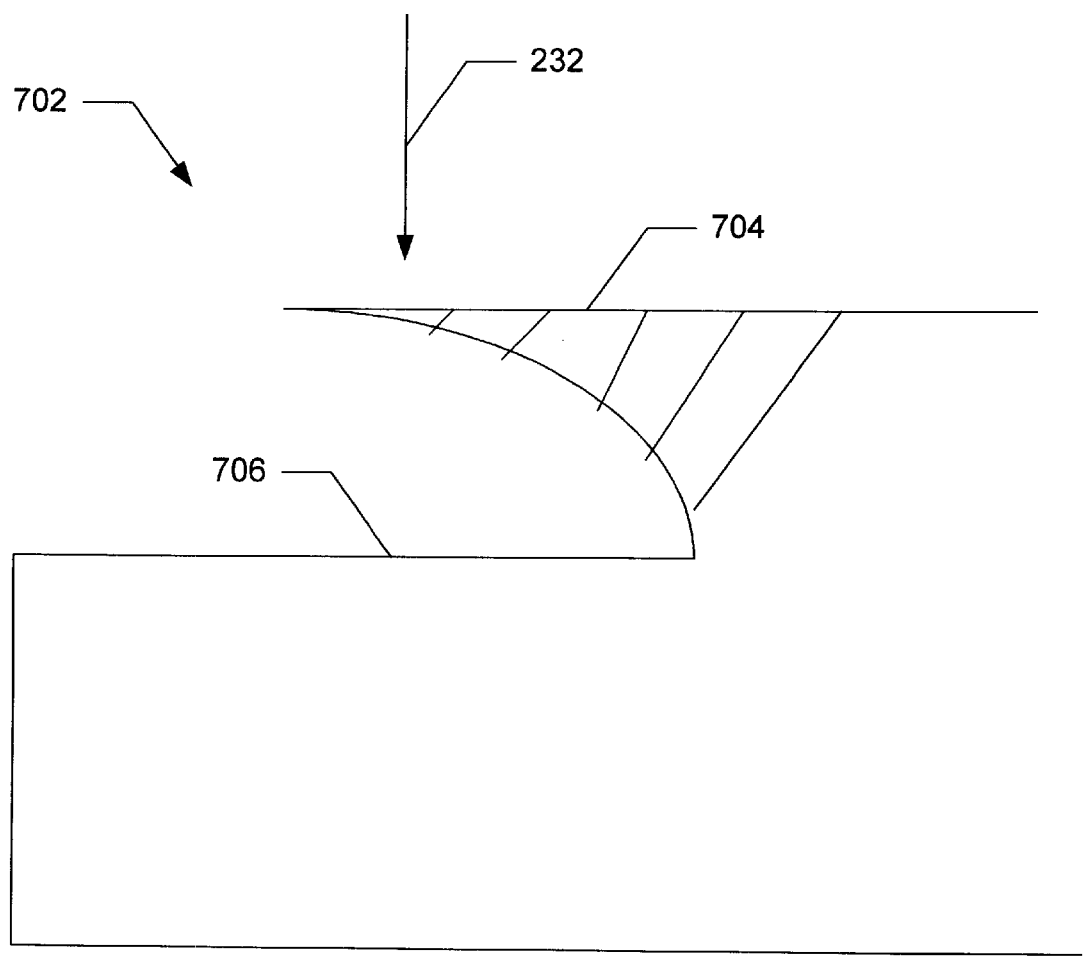
FIG. 7 shows an example of a work piece that can be processed by the present invention.

FIG. 7 shows an example work piece that can be processed using the present invention. A contour pattern is to be milled/machined away from a work piece 702 as shown in FIG. 7. In this example, only shaded area 704 is to be removed and area 706 beneath the overhanging shaded area 704 needs to be protected as much as possible from being machined or exposed to the beam.

Figure 8:
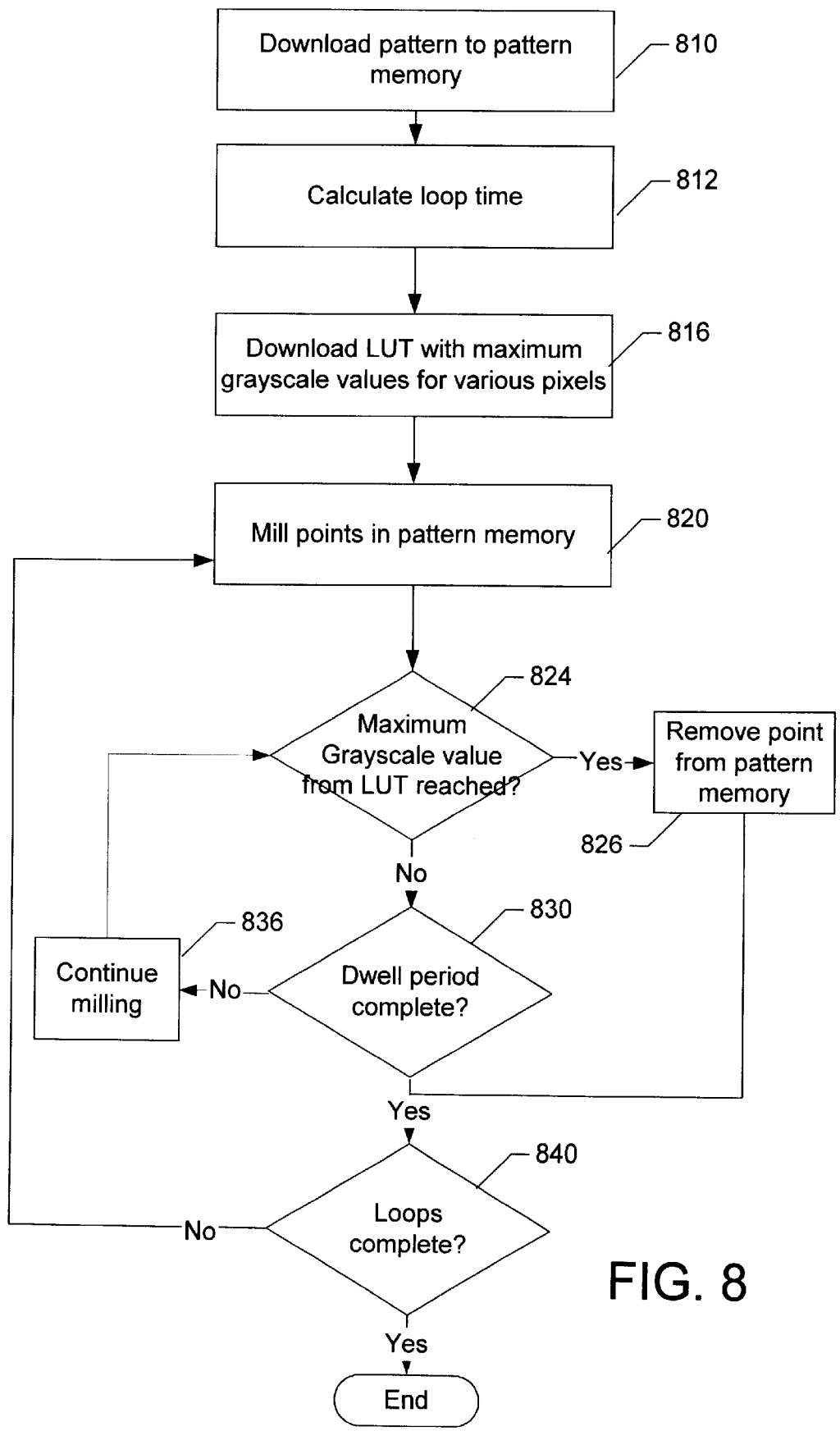
FIG. 8 is a flowchart showing the steps used to process the work piece of FIG. 7.

FIG. 8 shows steps used to process the work piece of FIG. 7. In step 810, a pattern is downloaded to pattern memory 210. The pattern uses a contour dwell time along the horizontal axis, that is, the dwell time changes with the location of the point along the horizontal axis, so that shorter dwell times are used to the left of the figure and longer dwell-times are used on the right. In step 812, a "loop-time" is also calculated for the pattern which determines how many times (=loop count) the pattern will be scanned over the area. It is well known that loop count needs to be high to reduce redeposition of material which will reduce dwell-times for all points by a constant number. All these calculations are done based on sputter rate and beam energy.

In step 816, a look up table 430 is also downloaded to the process and memory control unit 410. The look up table 430 holds the maximum values of grayscale that can be tolerated along the horizontal axis. Note that endpoint conditions other than maximum values can also be used, such as accumulated values or minimum values. The grayscale values correspond to the image intensity, which will correspond to the material under the beam. If, in the example of FIG. 7, area 706 is composed of one type of material, all entries in the look up table 430 would be the same, because processing of each pixel will be stopped when the gray scale value indicates that the beam is impacting the material of area 706. If area 706 were divided into sub-areas composed of different materials, look up table 430 would include different grayscale values for pixels in the different sub areas, so that the system could recognize at any pixel when the beam had milled though area 704 was impacting the sub-area.

In step 820, milling is begun. In step 824, when a pixel or coordinate point reaches the maximum allowed value, the process and memory control unit 410 eliminates this pixel point in step 826 from the pattern memory 210 by marking the address (X and Y) so that this address will be skipped next time around, If the maximum grayscale value was not found to be reached in step 824, the beam continues in step 836 to dwell at that point until the dwell period is determined to be complete in step 830. This is repeated until all pixels have been removed or the total mill-time, calculated in advance as a number of loops, has been completed. In accordance with the invention, the grayscale level can be checked while milling; it is not necessary to stop milling and perform a separate imaging scan. The grayscale level can be checked repeatedly during a dwell period to reduce overmilling.

The invention has broad applicability and can provide many benefits as described and shown in the examples above. The embodiments will vary greatly depending upon the specific application, and not every embodiment will provide all of the benefits and meet all of the objectives that are achievable by the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A method of charged particle beam processing, comprising:

directing a beam of charged particles toward an arbitrary sequence of multiple points on a specimen surface to process the points; and detecting while processing the multiple points a signal corresponding to each of the multiple points, the signal generated by the charged particle beam processing of the point;

storing in a memory location associated with each of the multiple points a value derived from the signal corresponding to that point; and comparing the detected signals to criteria and if one of the signals meets a criterion, altering the beam processing of the corresponding point from the arbitrary sequence of multiple points.

2. The method claim 1 in which comparing the detected signal to criteria includes comparing the detected signal to criteria while the beam is processing the point at which the signal is generated.

3. The method claim 1 in which directing a beam of charged particles toward an arbitrary sequence of multiple points includes directing the beam toward each of the points in multiple passes and in which comparing the detected signal to criteria includes comparing the detected signal to criteria during the pass in which the signal was generated.

4. The method claim 1 in which directing a beam of charged particles toward an arbitrary sequence of multiple points on a specimen surface includes directing a focused ion beam or an electron beam toward an arbitrary sequence of multiple points on a specimen surface.

5. The method claim 1 in which directing a beam of charged particles toward an arbitrary sequence of multiple points on a specimen surface includes directing the beam to dwell at different points in the arbitrary sequence of multiple points for different durations.

6. A method of charged particle beam processing, comprising:
   directing a beam of charged particles toward arbitrary sequence of multiple points on a specimen surface process the points; and
   detecting while processing the multiple points a signal corresponding to each of the multiple points, the signal generated by the charged particle beam processing of the point;
   storing the signal for each of the multiple points in a memory location associated with the corresponding point;
   comparing the detected signals to criteria and if one of the signals meets a criterion, altering the beam processing of the corresponding point from the arbitrary sequence of multiple points.

7. A method of charged particle beam processing, comprising:
   directing a beam of charged particles toward an arbitrary sequence of multiple points on a specimen surface to process the points;
   detecting while processing the multiple points a signal corresponding to each of the multiple points, the signal generated by the charged particle beam processing of the point;
   automatically determining a system delay corresponding to the delay between the time that the beam is directed to a point and the time that a signal generated by the beam at that point is received and in which detecting while processing the multiple points a signal corresponding to each of the multiple points includes using the delay time to determine which signal corresponds to each point; and
   comparing the detected signals to criteria and if one of the signals meets a criterion, altering the beam processing of the corresponding point from the arbitrary sequence of multiple points.

8. A method of simultaneously processing and collecting surface information using a charged particle beam system, comprising:
   directing a charged particle beam toward an arbitrary sequence of impact points on a work piece to purposefully alter the work piece surface;
   detecting particles emitted from the work piece at the one of the impact points; and
   forming or updating an image based upon the particles detected while the charged particle beam is purposefully altering the work piece surface.

9. The method of claim 8 in which:
   directing a charged particle beam toward an arbitrary sequence of impact points includes directing a charged particle beam toward each of the impact points during a dwell period and in which forming or updating an image includes forming or updating an image multiple times during the dwell period.

10. A method of forming an image using a charged particle beam system, comprising
    directing a beam of charged particles toward multiple points on a work piece surface; and
    detecting a signal caused by the impact of the charged particles on the multiple points on a work piece surface; and
    automatically determining a system delay corresponding to the time between the time the beam is directed to a particular point and the time that the beam signal caused by the impact of the beam at that point is detected; and
    determining based on the system delay time the position of the beam corresponding to a detected signal.

11. The method of claim 10 further comprising storing a value corresponding to the detected signal in a memory location corresponding to the position of the beam corresponding to a detected signal.

12. In a system in which a beam exposes points on a work piece surface under the direction of a beam control system and a detector detects a signal generated by the exposure to the beam of points on the surface, and in which there is a time delay between instructing the beam control system to move the beam to a specific point and receiving the signal generated by exposure of that point to the beam, a method of correlating the detected signal with the position of the beam on the surface when the signal was generated, comprising:
    determining a system delay by:
      providing to a control system one or more instructions directing the beam to perform one or more actions;
      receiving from a detector a signal corresponding to the result of the one or more actions; and
      measuring the time elapsed between sending an instruction to direct the beam and detecting a signal corresponding to the determining the time between elapsed time between providing instructions and detecting to determine a system delay time;
    providing to the control system instructions to direct the beam to a sequence of points;
    receiving from a detector a signal including signal elements generated by the exposure of points in the sequence to the beam;
    determining using the system delay time signal elements correspond to which point in the sequence.

13. The method of claim 12 in which providing to a control system one or more instructions directing the beam to perform one or more actions includes providing instructions to blank and unblank the beam.

14. The method of claim 13 in which in which providing to a control system one or more instructions directing the beam to perform one or more actions includes providing instructions to blank and unblank the beam multiple times.

15. The method of claim 12 in which providing to a control system one or more instructions directing the beam to perform one or more actions includes providing to a control system a series of pattern vectors, each pattern vector including coordinates of a point for the beam to expose, a dwell time, end an indication of whether or not to blank the beam during the dwell time.

16. The method of claim 12 further comprising storing a value corresponding to the signal element in a memory location associated with the corresponding point in the sequence of points.

17. The method of claim 12 further comprising comparing a value corresponding to the signal element with a criterion value to determine whether to further process the point corresponding to the signal element.

18. A system for processing a work piece by exposing portions of the work piece to a beam, comprising;
    a beam source;
    a beam deflector for directing the beam;

a detector for detecting signals generated by the impact of the beam on the work piece;

a pattern memory for storing arbitrary points to which the beam is addressed;

a frame memory for storing data corresponding to the signals generated on the work piece, the frame memory including a memory location for each of the arbitrary points to which the beam is addressed;

a control unit for determining a system delay, receiving a signal from the detector, using the system delay to determine to which of the arbitrary points the signal corresponds, and storing the corresponding data corresponding to each of the arbitrary points in the associated memory location.

19. The method of claim 18 in which the control unit includes a delay buffer that delays the presentation of information corresponding to the arbitrary points until the signal corresponding to that point is received.

20. The method of claim 19 in which the control unit includes a delay calibrator that determines the delay between sending an instruction to the beam deflector and receiving a corresponding signal from the detector.

21. The method of claim 18 in which the control unit includes a logic unit for determining whether data corresponding to a signal satisfies a criterion and for altering the beam processing of the criterion is satisfied.

* * * * *